US005487084A

United States Patent [19]
Lindholm

[11] Patent Number: 5,487,084
[45] Date of Patent: Jan. 23, 1996

[54] GENERATION OF A CLOCK FREQUENCY IN A SMART CARD INTERFACE

[75] Inventor: Rune Lindholm, Salo, Finland

[73] Assignee: Nokia Mobile Phones Ltd., Salo, Finland

[21] Appl. No.: 288,976

[22] Filed: Aug. 11, 1994

Related U.S. Application Data

[63] Continuation of Ser. No. 899,721, Jun. 17, 1992.

[30] Foreign Application Priority Data

Jun. 26, 1991 [FI] Finland ................................. 913108

[51] Int. Cl.$^6$ ........................................................... H04L 7/00
[52] U.S. Cl. ........................... 375/215; 375/220; 375/376; 375/377; 327/147; 327/156; 327/160; 331/25
[58] Field of Search ............................ 375/371, 373–377, 375/215, 220; 331/17, 18, 25, 172; 327/147, 151, 156, 160

[56] References Cited

U.S. PATENT DOCUMENTS

| 4,215,245 | 7/1980 | Bellisio ................................. 375/120 |
| 4,445,193 | 4/1984 | Mueller et al. ........................ 364/900 |
| 4,761,800 | 8/1988 | Lese et al. ............................ 375/121 |
| 4,815,099 | 3/1989 | Shimatani et al. ..................... 375/7 |
| 5,140,284 | 8/1992 | Petersson et al. ..................... 331/25 |
| 5,187,722 | 2/1993 | Petty ..................................... 331/25 |
| 5,258,877 | 11/1993 | Leake et al. ......................... 375/120 |

FOREIGN PATENT DOCUMENTS

| 913108 | 7/1992 | Finland . |
| 2613101 | 9/1988 | France . |
| 8802532 | 5/1990 | Netherlands . |
| 8502275 | 5/1985 | WIPO . |

OTHER PUBLICATIONS

"Gear–Shifted Phase–Locked Oscillator"–IBM Technical Disclosure Bulletin (vol. 14, No. 9, Feb. 1972)–D. J. Malone.
IBM Technical Disclosure Bulletin vol. 30, No. 1, Jun. 1987 New York US, pp. 26–27.

Primary Examiner—Stephen Chin
Assistant Examiner—Amanda T. Le
Attorney, Agent, or Firm—Perman & Green

[57] ABSTRACT

A circuit arrangement for generating the clock signal of a predetermined frequency f(UART) for a smart card interface, the interface being used for transferring data from a smart card to a device e.g. a mobile telephone at a predetermined data rate f(D). Using a phase-locked loop (PLL) and a number of programmable counters (N1–N4), the output of the circuit i.e. the smart card interface clock signal can have a frequency f(UART) which is a multiple of the data rate. In particular, the counters (N1–N4) and phase-locked loop (PLL) can be chosen so that f(UART) is sixteen times f(D) which allows a Universal Asynchronous Receiver Transmitter circuit to be used in the interface.

5 Claims, 2 Drawing Sheets

5,487,084

GENERATION OF A CLOCK FREQUENCY IN A SMART CARD INTERFACE

This is a continuation of application Ser. No. 07/899,721 filed on Jun. 17, 1992.

BACKGROUND OF THE INVENTION

This invention relates to a circuit arrangement for generating a clock frequency in a smart card interface.

Smart cards are often used in mobile telephones, amongst other devices. For example, mobile telephones using the German Netz-C system employ smart cards. In this system, the identification data of the mobile telephone are recorded on the smart card, such data being e.g. a call number and a code number as well as possible other data, which is then read into the mobile telephone via the smart card interface when needed. The pan European GSM (Groupe Speciale Mobile) mobile telephone system which is being adopted at present has also taken account of the use of a smart card.

The smart card interface is defined in the International Standards Organization (ISO) recommendation 7816-3. In the GSM system, the smart card implementation is based on this ISO recommendation, however some additional conditions have been set for a smart card implementation by the GSM recommendation 11.11.

The ISO recommendation 7816-3 defines various communication modes for a smart card interface. There is a basic distinction between the "Answer to reset" (ATR) mode and normal communication modes. The ISO recommendation also mentions that various communication protocols, i.e. signal systems used in communications, can be applied to the communication modes. One communication mode is defined in the ISO recommendation; it is called "T=O". This communication mode includes a parity check and a retransmission in the case of an error.

Universal Asynchronous Receiver Transmitter (UART) circuits are preferably used in the usual communication between the various equipment units. The protocol defined for the communication mode "T=O" however involves the special problem of the parity having to be checked in the input bit current and the possible error having to be detected 0.5 bits after the reception of the parity bit. Because of this requirement, a usual UART circuit cannot be used for the communication transmission of a smart card interface. This protocol involves another problem with regard to the definition in the recommendations, which requires a ratio of 372 between the clock frequency of the smart card and the data rate transmitted by the interface. The clock frequency for the data reading in UART circuits is usually 1, 16 or 64 times the data rate. When using the coefficient 1 in the implementation, the UART circuit would operate if the first requirement as to the error detection rate were satisfied. When using the coefficient 16 in the implementation, no problem would occur if the coefficient 16 were a factor in the number 372. However, this is not the case. The problem can be solved by adding to the system the frequency by means of which this problem is overcome. However, this solution involves the problems of committing oneself to a given clock frequency of the smart card, which can be altered during the use of the device, e.g. a mobile telephone, only by changing the externally fed clock frequency of the UART circuit accordingly. Nevertheless, such a situation would entail servicing the device, opening of the device and hence considerable costs.

SUMMARY OF THE INVENTION

According to the present invention, there is provided a circuit arrangement for generating a clock signal of a predetermined frequency for a smart card interface for coupling data from a smart card to a device, the data being transferred at a predetermined data rate, the arrangement comprising means for deriving the smart card interface signal from the smart card clock signal coupled to the arrangement, such that the frequency of the smart card interface clock signal and the data rate are of a predetermined ratio. Thus, the predetermined ratio can be selected so that the smart card interface has a clock signal frequency which is sixteen times the data rate, allowing a UART circuit to be used in the smart card interface.

BRIEF DESCRIPTION OF THE DRAWING

The invention will now be described, by way of example only, with reference to the enclosed drawings, in which:

FIGS. 2a and 2b are, respectively, a circuit diagram for the voltage-controlled oscillator used in the circuit of FIG. 1 and a timing diagram showing signal waveforms in the circuit of FIG. 2a;

FIGS. 3a and 3b are, respectively, a circuit diagram for the phase detector used in the circuit of FIG. 1, and a timing diagram showing signal waveforms in the circuit of FIG. 3a;

DETAILED DESCRIPTION

Figure 1:
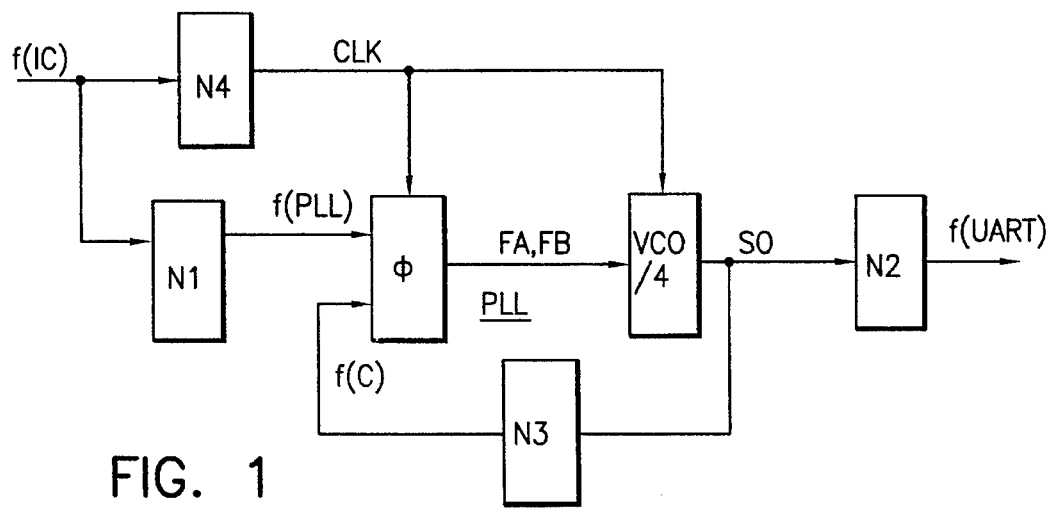
FIG. 1 is a simplified block diagram of the circuit arrangement according to the invention, in which the UART clock frequency is formed out of the clock frequency of the smart card by means of a phase-locked loop.

FIG. 1 is a simplified block diagram of the circuit arrangement according to the invention, from which, for the sake of clarity, elements without relevance for the present invention have been excluded, e.g. the control and current supply connections. The circuit arrangement can be incorporated in the smart card interface of a device e.g. a mobile telephone. In this case, a clock signal of the smart card having a frequency f(IC) is coupled from the interface to form the input signal of the circuit, and the output signal of the circuit, having a frequency f(UART), is recoupled to the interface between the smart card and the device for the reception and transmission of the data to be transferred. The circuit includes the programmable counters N1, N2, N3 and N4, a phase detector φ and a voltage-controlled oscillator VCO. The input signal of the circuit is the clock frequency f(IC) of the smart card (not shown) and the output signal is the clock frequency f(UART) to be conducted to the UART circuit (not shown).

The first counter N1 derives a reference signal, having a frequency f(PLL), of a phase-locked loop (PLL), from the input signal. Also derived from the input signal, using a fourth counter N4, is a clock signal for the phase detector φ and the oscillator VCO, having the pulse frequency CLK. A second counter N2 derives the UART clock signal, having a frequency f(UART) from the oscillator output signal so of the oscillator VCO. A third counter N3 is used for deriving a PLL feedback signal having a medium frequency f(C) of the phase-locked loop, from the oscillator output signal so input to the counter N3. When the phase-locked loop PLL has been locked to the correct frequency, the medium frequency f(C), i.e. the output of the counter N3, is equal to the reference frequency f(PLL). The counters are not shown in detail here, since they are well known and can be accomplished in various ways familiar to a person skilled in the art. However, it is essential that the waveforms of the outputs of counters N1–N4 be as symmetrical as possible. The solution according to the invention is also valid in a situation in which the ratio f(IC):f(D), where f(D) is the rate of data transmission transmitted by the smart card interface, has the form $2^n$ (n is a whole number), providing a particularly advantageous circuit solution.

The voltage-controlled oscillator VCO of this embodiment example is accomplished by using an adder as the programmable element and is illustrated in FIG. 2. The phase detector φ (in FIG. 3) controls the oscillator VCO dynamically by means of the input signals FA, FB. Without the feedback signal f(C), i.e. the loop being locked to the medium frequency f(C), the VCO divides the controlling clock frequency f(PLL) by four. The circuit according to the invention makes all the ratios divisible by four. The ratios, i.e. the ratios between the clock frequency f(IC) of the smart card and the data rate f(D) transmitted by the interface can here be controlled to the values f(IC)/f(D)=372, 512, 744, 768, 1024, 1116 or 1488. Thus, the data rate f(D) does not have to be generated separately, but instead a reference frequency f(PLL) is generated for the phase-locked loop, this frequency being an adequate multiple of the data rate f(D). The phase-locked loop multiplies this number with the value of the reference frequency 4×n2, yielding 16×f(D) as output frequency f(UART).

The operation of the circuit arrangement according to the invention and the optional variation of the output frequency are examined below with the help of diagrams. As mentioned above, the VCO divides the signal f(PLL) by four, when the loop has been locked to the feedback medium frequency f(C).

The medium frequency fc can be expressed by the formula f(C)=f(IC)/[n4×4×n3]; and the input frequency f(PLL) of the phase-locked loop PLL by the formula $$f(PLL)=f(IC)/n1; \text{ where}$$

n1, n2, n3 and n4 are the coefficients of the multipliers N1, N2, N3 and N4, respectively.

The phase-locked loop PLL remains locked to the medium frequency f(C), when the input signal f(PLL) deviates from the medium frequency fc over the locking range f1, i.e.

$$f(C)-f1<f(PLL)<f(C)+f1.$$

The locking range f1 equals the dynamic operating range of the phase-locked loop PLL with regard to the selected medium frequency f(c), and it can be expressed:

$$f1=[f(IC)/[n4\times4\times n3]]^2/[f(IC)/n4],$$

and this can be reduced into the forms:

$$f1=f(IC)/[[4\times n3]^2\times n4].$$

Under the control of, for example, the processor of a mobile telephone, various coefficients n1–n4 can be programmed into the counters N1–N4 by using control signals (not shown). The possible combinations concerned are presented in the following table 1. The indication "ratio" in the heading marks the ratio f(IC)/f(D) between the clock frequency f(IC) of the smart card and the data rate f(D) transmitted by the interface, as mentioned above. These are the various ratios defined in the ISO recommendation 7816-3.

TABLE 1

| Ratios f(IC)/f(D) achieved with the PLL circuit | | | | |
|---|---|---|---|---|
| Ratio | n1 | n2 | n3 | n4 |
| 372 | 93 | 1 | 4 | 6 |
| 512 | 64 | 2 | 4 | 4 |
| 744 | 93 | 2 | 4 | 4 |
| 768 | 64 | 3 | 4 | 4 |
| 1024 | 64 | 4 | 4 | 4 |
| 1116 | 93 | 3 | 4 | 6 |
| 1488 | 93 | 4 | 4 | 6 |

Figure 2A:
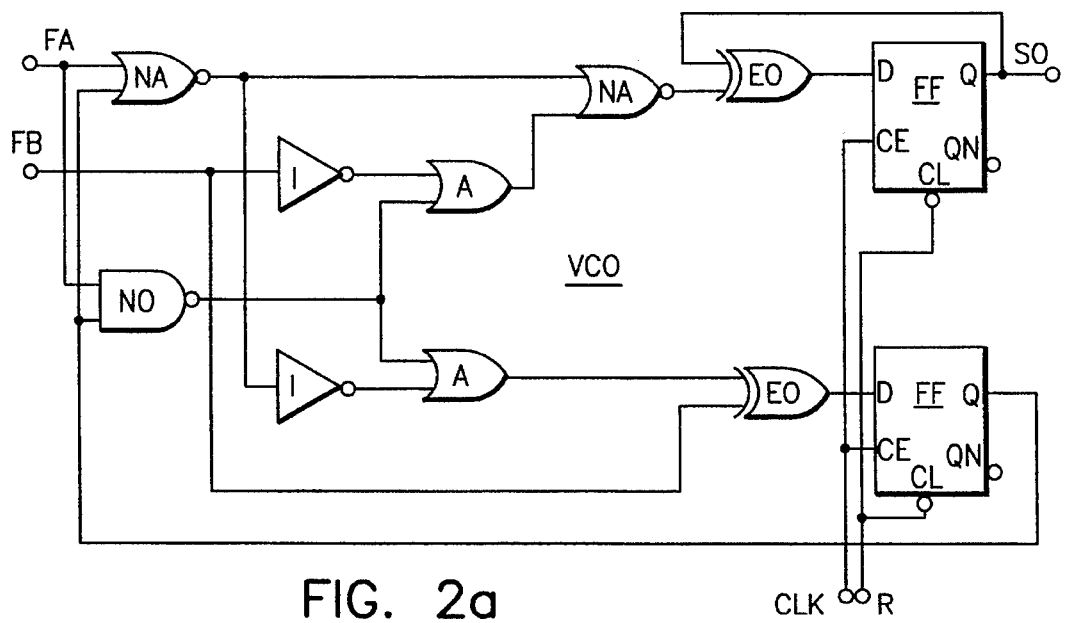
Figure 2B:
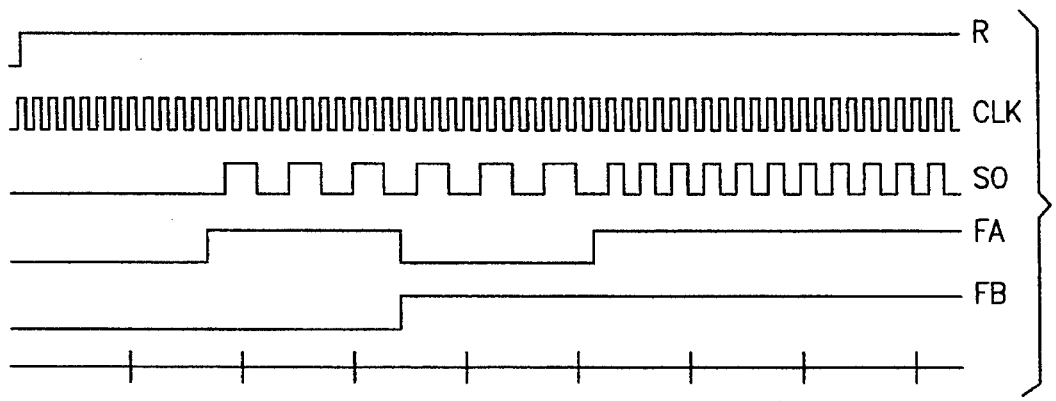

FIG. 2a shows a diagram of the VCO circuit in greater detail. As mentioned above, VCO has been carried out as an adder, the essential elements of which are two flip-flops FF. The other elements are NAND gates (NA), NOR gates (NO), AND gates (A) and Exclusive OR gates (EO) as well as NOT circuits (I). Depending on the values of the control signals FA, FB, CLK the output SO of VCO and thus of the PLL circuit can be kept unchanged, divided by two or divided by four. FIG. 2b shows the pulse diagram obtained by the circuit simulation, in which the logical time dependencies between the signals FA, FB, CLK, SO and a reset signal R are presented.

Figure 3A:
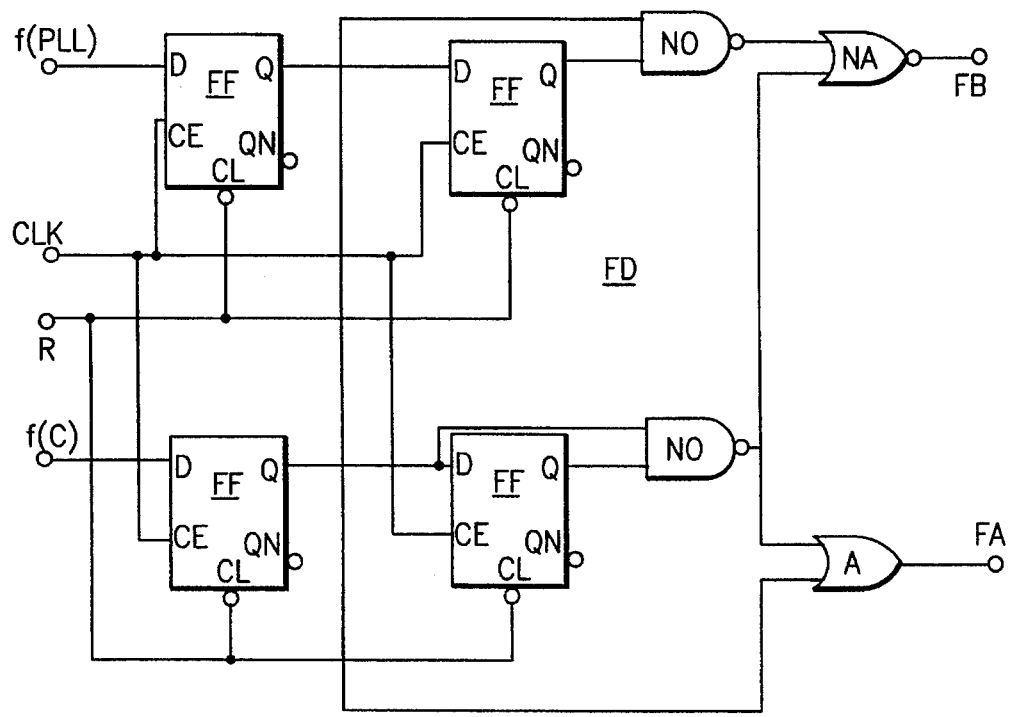

FIG. 3a shows a circuit diagram of the phase detector. The input signals are the PLL input signals and the PLL feedback signal of the phase-locked loop PLL, as mentioned above in the explanation of FIG. 1. Output signals of the phase detector are FA, FB.

Figure 3B:
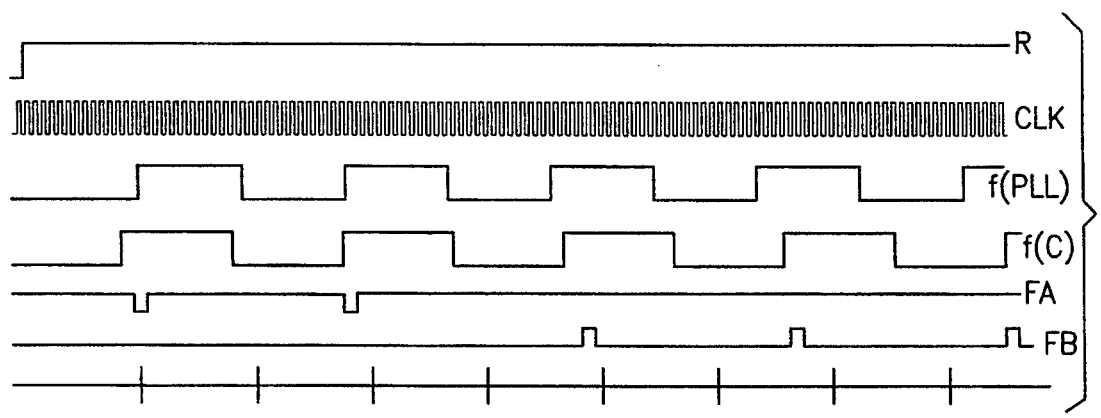

FIG. 3b shows a pulse diagram obtained with a circuit simulation, presenting the operating logic of the phase detector as a time diagram. When the frequency of the input signal f(PLL) is too high, pulses of the output branch FA are generated, as indicated on the left-hand side of FIG. 3b. Accordingly, when the frequency of the input signal f(PLL) is too low, pulses are generated in the output branch FB as indicated on the right-hand side of FIG. 3b.

The circuit solutions of FIGS. 2 and 3 are given merely as an example of an implementation of the circuit according to the invention. A person skilled in the art understands that these circuits can be carried out in many other ways, depending on the circuit elements available. Accordingly, the circuits can be partly or entirely accomplished with programs, for instance in an integrated processor.

I claim:

1. A circuit arrangement for generating a clock signal of a predetermined frequency for a smart card interface which couples data from a smart card to a device, the data being transferred at a predetermined data rate, the arrangement comprising means for deriving the smart card interface clock signal from a smart card clock signal coupled to the arrangement, such that the frequency of the smart card interface clock signal and the data rate are of a predetermined ratio;

wherein said deriving means comprises gating means for outputting selective pulses of the smart card clock signal to serve as said smart card interface clock signal;

said deriving means of the arrangement comprises a phase locked loop and at least one counter coupled to an input thereof, said one counter dividing a frequency of said smart card clock signal to output an input signal to said phase locked loop, the phase locked loop including said gating means, said one counter having a predetermined coefficient to provide said predetermined ratio;

said phase locked loop is a digitally operated phase locked loop responsive to a drive clock signal, said arrangement further comprising a second counter for dividing the frequency of said smart card clock signal to output said drive clock signal; and said phase locked loop has a locking range inversely proportional to a frequency division ratio of said second counter, the frequency division ratio of said one counter placing a frequency of said input signal to said phase locked loop within said locking range.

2. An arrangement according to claim 1 wherein said grating means provides the function of a voltage controlled oscillator, and the phase locked loop comprises a phase detector with said gating means being coupled thereto, the output of said gating means is fed back to a first input of the phase detector, said one counter being coupled to a second input of the phase detector for coupling said input signal as a reference signal thereto, the reference signal being outputted by said one counter and being derived from the smart card clock signal and having a frequency which is a multiple of the smart card clock signal frequency;

wherein the arrangement further comprises a third counter coupled to the output of the gating means to derive the smart card interface clock signal from the gating means output and having a frequency which is a multiple of the frequency of the gating means output, and such that the smart card interface clock signal frequency and the data rate have the predetermined ratio.

3. An arrangement according to claim 2 wherein the gating means divides the reference signal by four when the reference signal is locked to the feedback frequency.

4. An arrangement according to claim 1 wherein the predetermined ratio is chosen such that the smart card interface clock signal is sixteen times the data rate.

5. An arrangement according to claim 1 wherein the ratio of the smart card clock signal frequency to the data rate is $2^n$, where n is a whole number.

* * * * *

UNITED STATES PATENT AND TRADEMARK OFFICE
CERTIFICATE OF CORRECTION

PATENT NO. :   5,487,084
DATED      :   1/23/96
INVENTOR(S):   R. Lindholm

It is certified that error appears in the above-identified patent and that said Letters Patent is hereby corrected as shown below:

Column 5, line 10, "grating" should be --gating--.

Signed and Sealed this

Ninth Day of April, 1996

Attest:

BRUCE LEHMAN

*Attesting Officer*    Commissioner of Patents and Trademarks